(12) United States Patent
Arione et al.

(10) Patent No.: US 7,705,257 B2
(45) Date of Patent: Apr. 27, 2010

(54) TOUCH SWITCH FOR ELECTRICAL APPLIANCES AND ELECTRICAL APPLIANCE PROVIDED WITH SUCH SWITCH

(75) Inventors: Ettore Arione, Leggiuno (IT); Giuseppe Arena, Messina (IT); Roberto Lazzarotto, Castronno (IT); Giorgio Braghini, Varese (IT)

(73) Assignee: Whirlpool Corporation, Benton Harbor, MI (US)

( * ) Notice: Subject to any disclaimer, the term of this patent is extended or adjusted under 35 U.S.C. 154(b) by 0 days.

(21) Appl. No.: 12/247,407

(22) Filed: Oct. 8, 2008

(65) Prior Publication Data

US 2009/0090605 A1 Apr. 9, 2009

(30) Foreign Application Priority Data

Oct. 8, 2007 (EP) .................................. 07118016

(51) Int. Cl.
*H01H 9/00* (2006.01)

(52) U.S. Cl. ...................................... 200/314; 200/600
(58) Field of Classification Search ................... 200/314
See application file for complete search history.

(56) References Cited

U.S. PATENT DOCUMENTS

| 4,302,647 | A | * | 11/1981 | Kandler et al. | .............. 200/512 |
| 5,239,152 | A | * | 8/1993 | Caldwell et al. | ............ 200/600 |
| 5,607,048 | A | * | 3/1997 | Kaizu et al. | .................. 200/314 |
| 6,403,904 | B1 | | 6/2002 | Schilling | |
| 7,255,466 | B2 | * | 8/2007 | Schmidt et al. | .............. 362/501 |
| 2006/0243575 | A1 | | 11/2006 | Cenedese | |

* cited by examiner

*Primary Examiner*—Michael A Friedhofer
*Assistant Examiner*—Lheiren Mae A Anglo
(74) *Attorney, Agent, or Firm*—John W. Morrison; Diederiks & Whitelaw PLC

(57) ABSTRACT

A touch switch for an electrical appliance having a capacitive flat electrode, a light source, a transparent cover and a printed circuit board connected to the electrode is disclosed. The light source is mounted on a face of the printed circuit board opposite the transparent cover and the printed circuit board presents a cut-out for allowing light transmission from the light source towards the transparent cover.

12 Claims, 3 Drawing Sheets

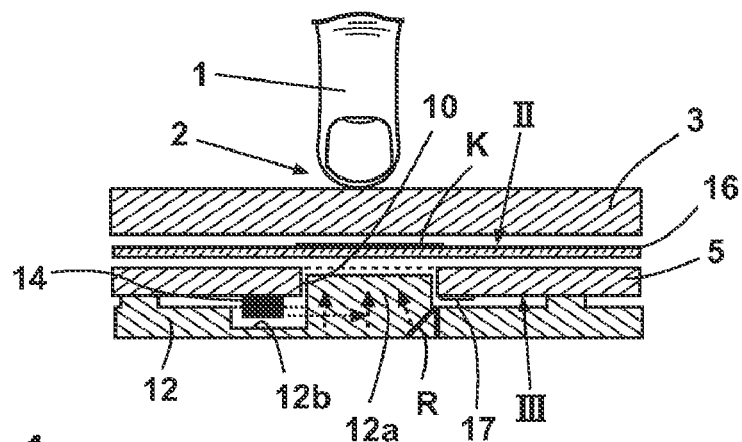
Fig. 1
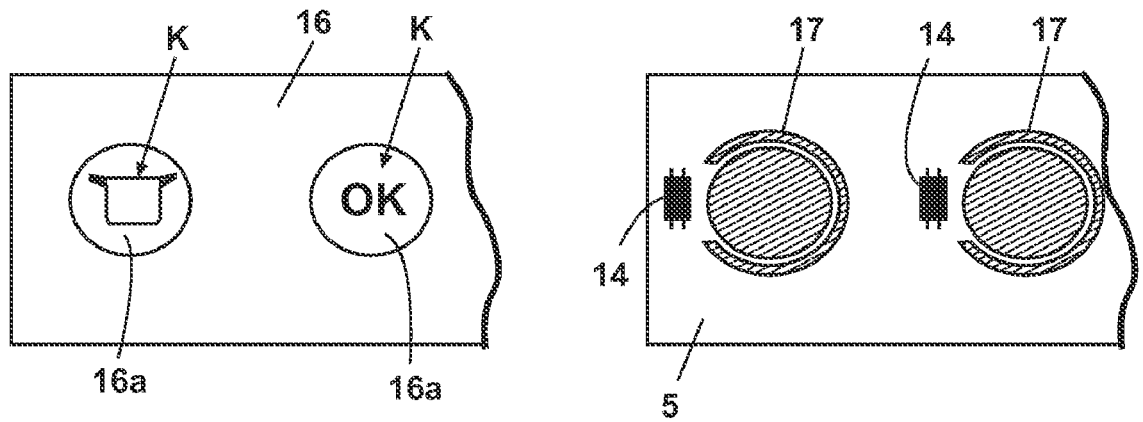
Fig. 2
Fig. 3
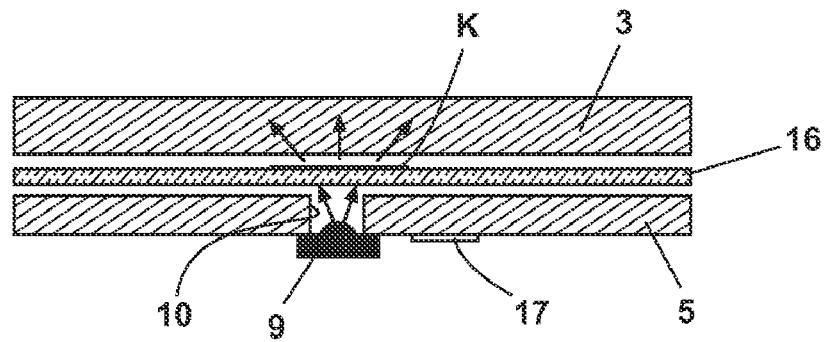
Fig. 4

TOUCH SWITCH FOR ELECTRICAL APPLIANCES AND ELECTRICAL APPLIANCE PROVIDED WITH SUCH SWITCH

BACKGROUND OF THE INVENTION

1. Field of the Invention

The present invention relates to a touch switch for an electrical appliance to be used on control panels thereof. The invention also refers to a capacitive touch switch comprising a capacitive flat sensor surface, a light source, a transparent cover provided over said touch switch and a printed circuit board connected to the capacitive sensor element.

2. Description of the Related Art

With the term "switch" we mean every kind of touch sensors which usually replace the traditional buttons in modern flush user interfaces.

Visual feedback activation of a touch switch control is simply provided by a light source, for example a light emitting diode (LED). Usually several touch switches are arranged, together with control board thereof, in a control panel.

To avoid optical interference between adjacent touch switches, light flux shall be conveyed from a light source to the related touch sensitive switch surfaces.

Opaque walls or light guide means are normally provided for this object. The use of opaque walls increases physical dimensions and renders the mounting quite complex.

Light guides can be used as mechanical support for the electrodes. Electrodes can also be made of transparent conductive material (such as indium tin oxide), located between the light guide and the lower surface of the transparent cover under which the touch switch is placed, with an increase of the overall cost of the control panel.

On top of the above illumination problems, there is the need of assuring a good mechanical connection between the touch switch and the transparent cover (usually a glass or plastic plate) under which the switch is placed. Up to now, for assuring such mechanical contact springs or conductive rubber elements have been used, which may increase the overall cost and complexity of the single touch switch, particularly as far as the need of assuring a good electrical contact of the springs is concerned. Moreover, technical solutions are known (for instance from US-A-2006/0243575) in which a support member, carrying electronic components, is separated from the transparent cover by a series of opaque septum-like partitions for creating physically delimited illumination channels. Even if such solution does not require light guides (light emitting diodes are placed on the support member directly), nevertheless it is quite bulky and of complex manufacturing.

SUMMARY OF THE INVENTION

It is an aspect of the present invention to propose a different structural arrangement of a touch switch in order to allow a reduction of physical dimensions of the switch, easy mounting process, and improvement on versatility for different symbols as painted objects.

Another aspect of the present invention is to provide a touch switch that has an improved sensibility.

A further aspect of the present invention is to provide a capacitive touch switch without an external icon serigraphy and which, when not activated or not in use (when the control panel is off) is not visible by the user.

A further aspect of the present invention is to provide a touch switch that can give a direct feedback to the user when a command has been duly received.

A further aspect of the present invention is to provide a touch switch that is substantially invisible by the user, its presence being detected only when the user's finger touches an enabling switch.

The disclosure also discloses a touch switch of the above type in which the light source includes an illuminated display.

A capacitive touch sensor of this specific type is disclosed by U.S. Pat. No. 6,403,904 in which a housing of a seven-segment display is soldered to with soldering pins to the printed circuit board detached from the transparent cover. The capacitive flat sensor surface in contact with the transparent cover has a frame-shaped flat portion around the seven-display housing and is connected to the printed circuit board by means of standing legs. This technical solution is quite bulky, due to the thickness of the standard seven-segment display package. Moreover it needs a precise mounting for assuring a correct contact of the capacitive flat sensor surface against the transparent cover. In order to overcome this problem, known touch switches make use of actuators or conductive elements (springs, sponges, rubbers, etc. . . . ) for the electrical contact and the mechanical arrangement between touch area and touch sensor.

Another aspect of the above known solution is that the capacitive surface is obtained starting from a metal sheet from which are punched or worked the central cut-out and notches, which leads to an increase of the overall cost of the touch switch.

Another solution could use a printed circuit board (PCB) having a bigger thickness, for example 4 mm, to avoid the use of actuators or conductive elements. The use of such thick PCB increases the overall cost of the touch switch, and moreover it can create problem of differential thermal expansion particularly when the touch switch is used in cooking appliances (cooking hobs, ovens) where the temperature of the switch can reach values closer to 100° C. or above.

It is a further aspect of the present invention to provide a capacitive touch switch with an illuminated display that does not present the above problems and that has a reduced cost.

According to the invention, the above aspects are obtained to the features listed in the appended claims.

According to the present invention, no leg is needed to cover the gap between touch area and sensor surface due to light source or display package.

Moreover there is no need to use PCB having a big thickness, for example 4 mm or above, or multilayered PCB to cover gap between touch area and touching sensor due to display package.

BRIEF DESCRIPTION OF THE DRAWINGS

Further features and advantages of a touch switch according to the present invention will become clear from the detailed description provided as a non limiting example, with reference to the attached drawing in which:

FIG. 1 shows a cross section of a touch switch according to a first embodiment of the present invention;

FIG. 2 is a top view of a component of the touch switch of FIG. 1;

FIG. 3 is a view from the bottom of another component (PCB) of the touch switch of FIG. 1;

FIG. 4 shows a cross section of a touch switch according to a second embodiment of the present invention;

DETAILED DESCRIPTION OF THE PREFERRED EMBODIMENTS

With reference to the drawings, a touch switch presents a non-conductive transparent cover 3, for instance of glass or polymeric material. On the transparent cover 3 there is at least one touch sensitive area 2 adapted to be touched by the user's finger 1.

Figure 5:
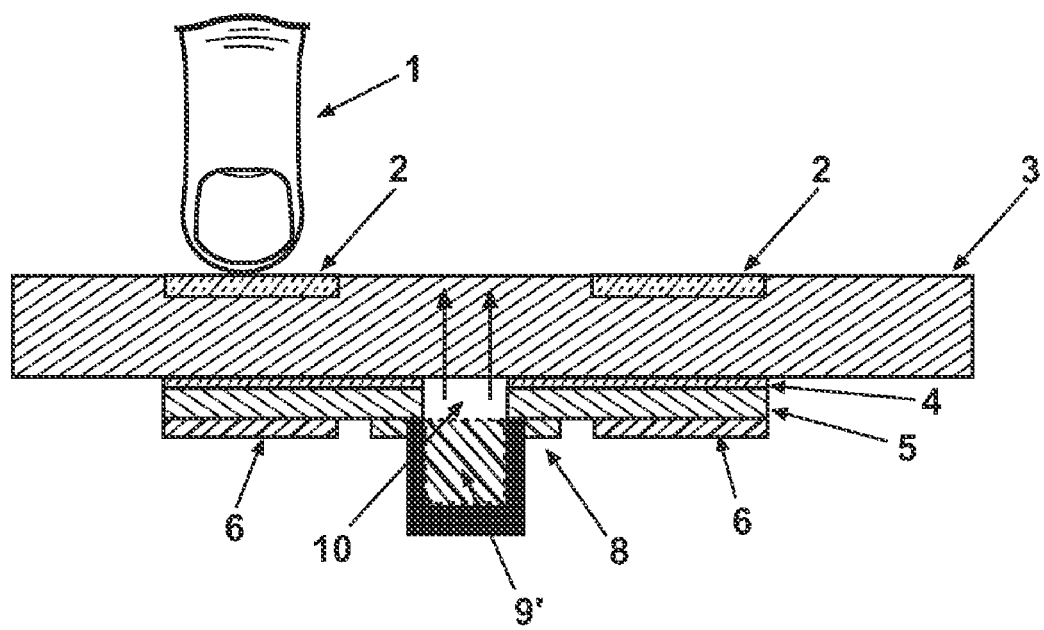
FIG. 5 shows a cross section of a touch switch according to a third embodiment of the present invention.

On the lower face of the transparent cover 3, a single side printed circuit board (PCB) 5 is attached by means of a non-conductive transparent adhesive 4 (figure 5). The PCB 5 is provided with a cut-out 10.

With reference to FIG. 1, on the side of the PCB 5 opposite the transparent cover 3 (i.e. the side with the metallic tracks), there is provided a plastic light guide 12 in the form of a planar sheet provided with a protrusion 12a located in the cut-out 10 of the PCB. The light guide 12 is fixed to the PCB 5 by means of adhesive or the like, and adjacent the protrusion 12a the light guide 12 presents a seat 12b in which a LED 14, electrically connected to and supported by the PCB 5, is placed. In the area surrounding the cut-out 10, the PCB 5 presents an annular track 17 which acts as a touch electrode and is interrupted in correspondence of the LED 14 (FIG. 3). Between the transparent cover 3 and the PCB 5 a polymeric film 16 is interposed, that has the function of a light filter. The film 16 is substantially opaque and presents circular transparent zones 16a where icons K are obtained by printed serigraphy. When the LED 14 is switched on, light is guided in the protrusion 12a, possibly with the help of reflective portions R inside the light guide 12. Therefore light emerges from the protrusion 12a and is filtered by the film 16, displaying the respective icon K as shown in FIG. 2. The level of illumination may be linked to the electrical state of the touch switch. For instance, when the appliance is switched on all the icons K can be illuminated at a first identical level in order to allow the user choosing among them. When the user touches a switch, the level of illumination of that single switch is automatically increased to a second higher level in order to give the user an immediate feedback. The use of the film 16 improves the flexibility of use of the user interface. For example, by just changing this layer it is possible to easily customize the user interface for different countries and languages. When a big light diffusion effect is requested, the film 16 can be thicker (few millimeters) with "ad hoc" treated surfaces, otherwise this film can be very thin or it can be removed when the serigraphy is printed directly on the transparent cover 3.

Even if in the example of FIGS. 1 to 3 the touch electrode 17 is realized as a circular crown with a hole in the centre for the light guide, other shapes can be easily adopted.

The embodiment according to FIG. 4 differs from the previous one because no light guide is needed. In FIG. 4 parts which are identical or similar to the parts of the previous embodiment are indicated with the same reference numerals. On a face of the PCB 5 opposite the transparent cover 3 a body package 9 of a reversed mounted LED is soldered around the cut-out 10 by means of metal pins. Also in this case the touch electrode 17 is realized as a circular crown.

Figure 6:
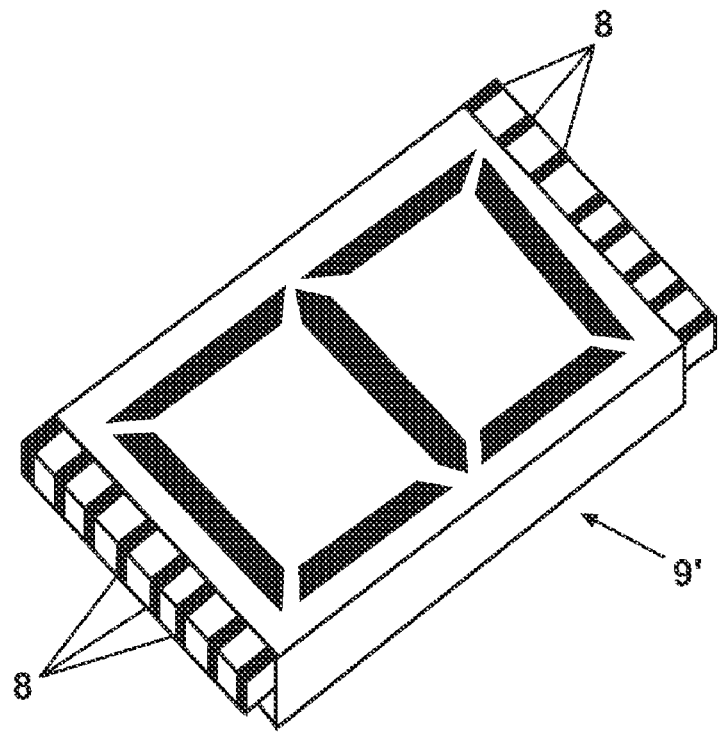
FIG. 6 is a perspective view of a seven-segment display used in the embodiment of FIG. 5.

In the embodiment shown in FIGS. 5 and 6, the body package around the cut-out 10 is a seven-segment display 9' which is soldered by means of metal pins 8. On the same surface of the PCB 5 there are provided two electrodes 6 that, for examples, can be used for increasing (+) or decreasing (−) a certain parameter. The mounting of the seven-segment display 9' is very easy. A low cost single side PCB 5 with standard thickness as FR4 or CEM1 type can be used. No conductive elements like spring or sponges or conductive rubber have to be used. An air gap between the seven-segment display 9' and transparent cover assures better performances in hot applications like cooktops or oven. Moreover, when the display is switched off, it is not seen by the user (dark effect on surface when off). A further advantage of using a display as the one shown in FIG. 6 relates to the possibility of using a display whose thickness may be different from the thickness of the PCB. As a matter of fact in the standard known solution the thickness of the display must be identical to the thickness of the PCB, and the soldering part of the display must be flush with the surface of the PCB. This is no longer needed with a display according to the present invention.

Figure 7:
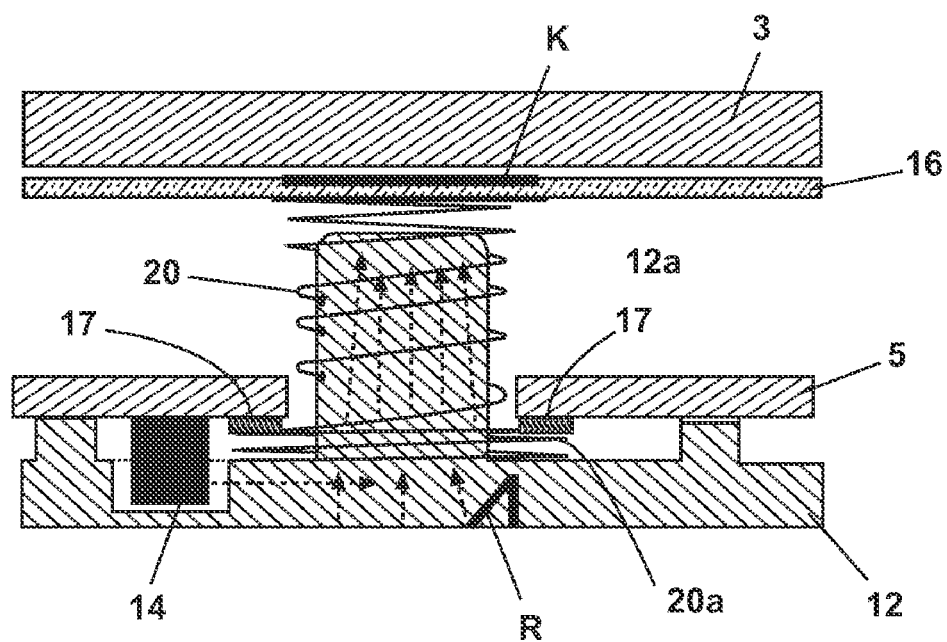
FIG. 7 shows a cross section of a touch switch according to a fourth embodiment of the present invention.

Another embodiment is shown in FIG. 7, which is quite similar to the embodiment according to FIGS. 1 to 3 but it can be used also when the transparent cover 3 is not flat. In this embodiment the protrusion 12a of the light guide 12 is not substantially flush with the PCB 5, rather it goes beyond the plane of the PCB towards the transparent cover 3 that, in this case, is detached from the PCB. For assuring a proper working of the touch switch, a metal spring 20 is interposed between the PCB 5 and the film 16 carrying the icons serigraphy K and in contact with the transparent cover 3. The spring 20 has an enlarged end 20a sandwiched between the PCB (on the circular track 17) and the light guide 12.

The embodiment according to FIG. 7 provides the following functionality and advantages. The more large part 20a of the spring 20 compressed between the PCB and the plastic light guide or support provides a good electrical contact between the touch electrodes 17 (contacts) and the spring. This arrangement avoids the cost for a double side PCB and for a welding process of the spring. To avoid the welding process allows using a cheaper material for the spring 20 (no tinned steel is required). The other end of the spring 20 is pressed on upper layers (user interface surface and light filter and serigraphy), providing the electrical continuity of the touch sensor closed to the user interface surface (avoiding the air gap between touch sensor and user interface surface).

The touch performance is improved if more spring coils when pressed are closed to the user interface surface, because this improves the surface of the capacitor plate of the sensor.

Figure 8:
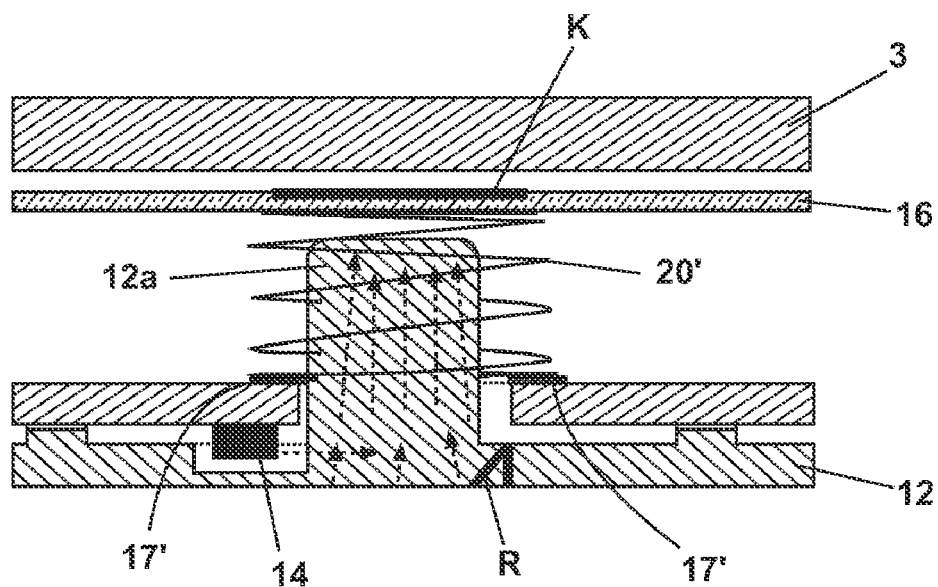
FIG. 8 shows a cross section of a touch switch according to a fifth embodiment of the present invention.

A further embodiment similar to the previous one is shown in FIG. 8 where the spring 20' does not have any enlarged end and it is interposed between the PCB 5 and the transparent cover 3 (with the optional interposition of the plastic film 16 with serigraph). In this solution the touch sensors/electrodes 17' are realized on PCB in the opposite side where LED 14 is placed.

We claim:

1. A capacitive touch switch for an appliance comprising:
   a non-conductive transparent cover;
   a printed circuit board below the non-conductive transparent cover, said printed circuit board including a cut-out portion;
   a touch electrode mounted on the printed circuit board adjacent the cut-out portion;
   a light source mounted below the printed circuit board at a position offset from the cut-out portion; and
   a light guide extending below the printed circuit board, wherein the light guide directs light emitted by the light source through the cut-out portion of the printed circuit board towards the non-conductive transparent cover.

2. The capacitive touch switch of claim 1, wherein the touch electrode is in the form of an annular track surrounding a majority of the cut-out portion of the printed circuit board.

3. The capacitive touch switch of claim 1, further comprising:
    an auxiliary layer interposed between the non-conductive transparent cover and the printed circuit board, the auxiliary layer having a transparent zone including an opaque icon.

4. The capacitive touch switch of claim 3, wherein the auxiliary layer is a light filtering polymeric film.

5. The capacitive touch switch of claim 1, wherein the printed circuit board is fixed to the non-conductive transparent cover by a non-conductive adhesive.

6. The capacitive touch switch of claim 1, wherein the light guide includes a protrusion extending into the cut-out portion of the printed circuit board, wherein the light guide directs light from the light source through the protrusion towards the non-conductive transparent cover.

7. The capacitive touch switch of claim 6, wherein the light guide is formed of plastic.

8. The capacitive touch switch of claim 6, wherein the light guide further includes a seat portion defining a channel into which the light source extends.

9. The capacitive touch switch of claim 6, further comprising:
    a metal spring mounted between the non-conductive transparent cover and the printed circuit board and in contact with the touch electrode.

10. The capacitive touch switch of claim 9, wherein the metal spring extends around the periphery of the light guide protrusion.

11. The capacitive touch switch of claim 10, wherein an enlarged end of the metal spring is sandwiched between the printed circuit board and the light guide.

12. The capacitive touch switch of claim 9, wherein the light guide further includes a reflective portion adapted to reflect light from the light source through the protrusion.

* * * * *